United States Patent
Gonzalez (10) Patent No.: US 6,653,677 B2
(45) Date of Patent: Nov. 25, 2003

(54) SEMICONDUCTOR CONSTRUCTIONS (75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 10/066,013

(22) Filed: Oct. 22, 2001

(65) Prior Publication Data

US 2002/0102816 A1 Aug. 1, 2002

Related U.S. Application Data (62) Division of application No. 09/592,604, filed on Jun. 12, 2000.

(51) Int. Cl.$^7$ .............................................. H01L 27/108
(52) U.S. Cl. ....................................................... 257/300
(58) Field of Search ................................. 438/409, 506, 438/455; 257/300

(56) References Cited

U.S. PATENT DOCUMENTS

| | | | |
|---|---|---|---|
| 4,891,329 A | 1/1990 | Reisman et al. | |
| 5,298,449 A | 3/1994 | Kikuchi | |
| 5,374,564 A | 12/1994 | Bruel | |
| 5,374,581 A | 12/1994 | Ichikawa et al. | |
| 5,855,693 A | 1/1999 | Murari et al. | |
| 5,877,070 A | 3/1999 | Goesele et al. | |
| 5,882,987 A | 3/1999 | Srikrishnan | |
| 5,894,152 A | 4/1999 | Jaso et al. | |
| 5,953,622 A | 9/1999 | Lee et al. | |
| 5,998,847 A | 12/1999 | Assaderaghi et al. | |
| 6,004,406 A | 12/1999 | Kobayashi et al. | |
| 6,083,324 A | 7/2000 | Henley et al. | |
| 6,150,031 A | 11/2000 | Yonehara | |
| 6,245,161 B1 | 6/2001 | Henley et al. | |
| 6,251,754 B1 * | 6/2001 | Ohshima et al. | 438/506 |
| 6,309,945 B1 * | 10/2001 | Sato et al. | 438/409 |
| 6,384,439 B1 | 5/2002 | Walker | |
| 6,423,992 B2 | 7/2002 | Fukuda et al. | |
| 6,429,070 B1 * | 8/2002 | Gonzalez et al. | 438/253 |

OTHER PUBLICATIONS

Gösele, U. et al., "Semiconductor Wafer Bonding: Science, Technology, and Applications", Electrochemical Society Proceedings vol. 97–36, (©1998), pp. 400–425, 436–445.

* cited by examiner

*Primary Examiner*—David Nelms
*Assistant Examiner*—Thao Le
(74) *Attorney, Agent, or Firm*—Wells St. John P.S.

(57) ABSTRACT

The invention includes a method of forming a semiconductor construction. A first substrate is provided which comprises silicon-containing structures separated from one another by an insulative material. The silicon-containing structures define an upper surface. A second semiconductor substrate is provided which comprises a monocrystalline material having a damage region therein. The second semiconductor substrate is bonded to the silicon-containing structures of the first substrate at the upper surface. The monocrystalline material is then cleaved along the damage region. The invention also encompasses a semiconductor construction comprising a first substrate having silicon-containing structures separated from one another by an insulative material, and a second substrate comprising a monocrystalline material. The silicon-containing structures of the first substrate define an upper surface, and the monocrystalline material of the second substrate is bonded over the silicon-containing structures at the upper surface.

17 Claims, 7 Drawing Sheets

FIG. XIII

FIG. XIV

_Fig. 14_

_Fig. 15_

SEMICONDUCTOR CONSTRUCTIONS

RELATED PATENT DATA

This patent resulted from a divisional application of U.S. patent application Ser. No. 09/592,604, which was filed on Jun. 12, 2000.

TECHNICAL FIELD

The invention pertains to methods of forming semiconductor constructions in which a first semiconductor substrate is bonded to a second semiconductor substrate. The invention also pertains to semiconductor constructions comprising a first semiconductor substrate bonded to a second semiconductor substrate.

BACKGROUND OF THE INVENTION

Technologies referred to as "smart cut" and "wafer-bonding" have been utilized to bond monocrystalline silicon materials onto semiconductor substrates. Smart cut technology generally refers to a process in which a material is implanted into a silicon substrate to a particular depth and ultimately utilized to crack the substrate, and wafer bonding technology generally refers to a process in which a first semiconductive substrate is bonded to a second semiconductor substrate.

In particular applications of smart cut and wafer-bonding technology, hydrogen ions (which can be, for example, $H^+$, $H_2^+$, $D^+$, $D_2^+$) are implanted into a first monocrystalline silicon substrate to a desired depth. The first monocrystalline silicon substrate comprises a silicon dioxide surface, and is bonded to a second monocrystalline substrate through the silicon dioxide surface. Subsequently, the bonded first substrate is subjected to a thermal treatment which causes cleavage along the hydrogen ion implant region to split the first substrate at a pre-defined location. The portion of the first substrate remaining bonded to the second substrate can then be utilized as a silicon-on-insulator (SOI) substrate. An exemplary process is described in U.S. Pat. No. 5,953,622. The SOI substrate is subsequently annealed at a temperature of greater than or equal to 900° C. to strengthen chemical coupling within the second substrate.

The present invention encompasses new applications for smart cut and wafer-bonding technology, and new semiconductor structures which can be created utilizing such applications.

SUMMARY OF THE INVENTION

In one aspect, the invention includes a method of forming a semiconductor construction. A first substrate is provided which comprises silicon-containing structures separated from one another by an insulative material. The silicon-containing structures define an upper surface. A second semiconductor substrate is provided which comprises a monocrystalline material having a damage region therein. The second semiconductor substrate is bonded to the silicon-containing structures of the first substrate at the upper surface. The monocrystalline material is then cleaved along the damage region.

In another aspect, the invention encompasses another method of forming a semiconductor construction. A first substrate is provided which comprises silicon-containing structures separated from one another by an insulative material. The silicon-containing structures define an upper surface. A second semiconductor substrate is bonded to the silicon-containing structures at the upper surface. The second semiconductor substrate comprises a mono-crystalline material. At least one doped silicon region is formed to extend through the monocrystalline material and to electrically contact at least one of the silicon-containing structures.

In another aspect, the invention encompasses a semiconductor construction comprising a first substrate having silicon-containing structures separated from one another by an insulative material, and a second substrate comprising a monocrystalline material. The silicon-containing structures of the first substrate define an upper surface, and the monocrystalline material of the second substrate is bonded over the silicon-containing structures at the upper surface.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
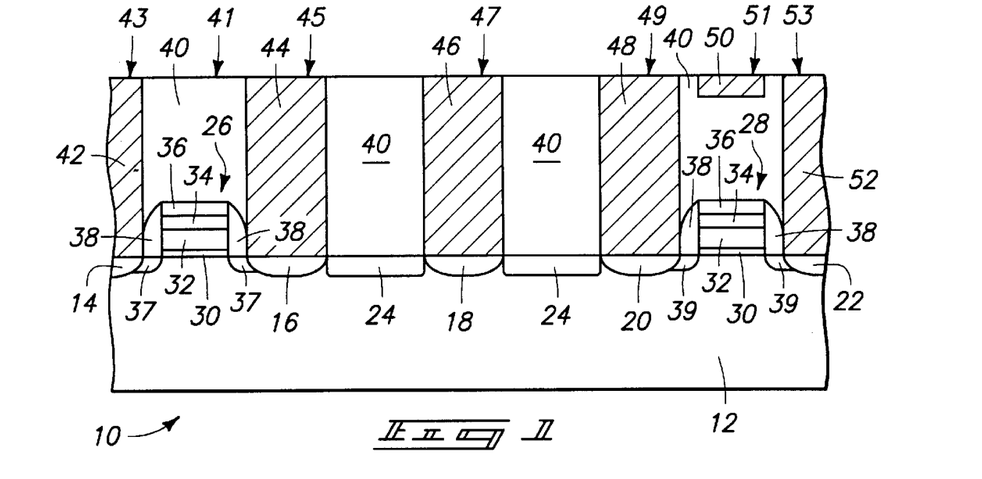
FIG. 1 is a diagrammatic, cross-sectional view of a first semiconductor substrate at a preliminary step of a method of the present invention.

An exemplary method of the present invention is described with reference to FIGS. 1–15. Referring to FIG. 1, a first semiconductor substrate 10 is illustrated in fragmentary view. Substrate 10 comprises a monocrystalline silicon wafer 12 having conductively-doped diffusion regions 14, 16, 18, 20, 22, 37 and 39 therein. Diffusion regions 14, 16, 20, 22, 37 and 39 can comprise, for example, either n-type or p-type conductivity-enhancing dopants. Monocrystalline silicon wafer 12 can comprise a background doping with a p-type dopant. Although wafer 12 is described as comprising monocrystalline silicon, it is to be understood that wafer 12 can comprise other semiconductive materials, including, for example, germanium; or can comprise combinations of semiconductive materials, such as, for example, a combination of silicon and germanium. Wafer 12 can be referred to herein and in the claims that follow as a first base. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative isolation regions 24 are formed within substrate 12. Isolation regions 24 can comprise, for example, silicon dioxide, and can be formed as shallow trench isolation regions.

Transistor gates 26 and 28 are formed over substrate 12 and comprise a gate oxide layer 30, a polysilicon layer 32, a silicide layer 34 and an insulative cap 36. Sidewall spacers 38 are shown formed along gates 26 and 28. Gate 26, together with diffusion regions 14, 16 and 37, defines a first field effect transistor, and gate 28 together with diffusion regions 20, 22 and 39 defines a second field effect transistor. In embodiments in which diffusion regions 14, 16, 20 and 22 are heavier doped with n-type dopant than p-type dopant, the first and second field effect transistors comprise NMOS transistors. Alternatively, if diffusion regions 14, 16, 20 and 22 are heavier doped with p-type dopant than n-type dopant, the first and second transistors can comprise PMOS transistors. Regions 37 and 39 can comprise lightly doped diffusion (Ldd) regions. It is noted that the above-described first and second field effect transistors are conventional transistor structures, and are provided as exemplary circuitry comprised by semiconductor substrate 10. Other circuitry, including other forms of field effect transistors, can be comprised by semiconductor substrate 10 in alternative embodiments of the present invention.

An insulative material 40 is formed over wafer 12, and over transistor gates 26 and 28. Insulative material 40 can comprise, for example, silicon dioxide, borophosphosilicate glass (BPSG), or silicon nitride.

Silicon-containing structures 42, 44, 46, 48, 50 and 52 extend at least partially into insulative material 40, with structures 42, 44, 46, 48 and 52 extending entirely through material 40 to define plugs or pedestals. It is noted that the structure of FIG. 1 can be considered as comprising silicon-containing pedestals (defined by, for example, structures 44 and 46) separated by insulative regions (defined by insulative material 40), or alternately as comprising insulative pedestals (defined by insulative material 40) separated by silicon-containing regions (defined by, for example, structures 44 and 46).

The silicon-containing structures 42, 44, 46, 48, 50 and 52 can be formed by, for example, forming openings in insulative material 40, and subsequently filling the openings with a silicon-containing material. It is to be understood that the term silicon-containing structure encompasses, but is not limited to, structures which consist essentially of silicon, or consist of silicon. The silicon of structures 42, 44, 46, 48, 50 and 52 can comprise, for example, monocrystalline silicon, polycrystalline silicon, or amorphous silicon. In particular embodiments, the silicon of structures 42, 44, 46, 48, 50 and 52 can consist essentially of, for example, conductively-doped monocrystalline silicon, conductively-doped polycrystalline silicon, or conductively-doped amorphous silicon.

Structures 42, 44, 46, 48 and 52 are preferably conductively doped, as such structures comprise conductive interconnections to diffusion regions associated with wafer 12. In contrast, structure 50 is shown to not be connected with other circuit elements, and accordingly can remain undoped. Structure 50 will be described in the present disclosure as having no function as an electrical circuit element. Instead, structure 50 has a sole function of being provided for utilization in bonding a second semiconductor substrate through processing which is described below. Structure 50 has a different width than structures 42, 44, 46, 48 and 52 to emphasize that structure 50 can be formed by a different pattern than the other structures.

Silicon-containing structures 42, 44, 46, 48, 50 and 52 have upper surfaces 43, 45, 47, 49, 51 and 53, respectively. In the shown embodiment, such upper surfaces are planarized-relative to one another, and at a common elevation above wafer 12. Surfaces 43, 45, 47, 49, 51 and 53 thus define a common planarized upper surface which can be utilized in subsequent bonding (described below) to a second semiconductor substrate. The common upper surface of silicon-containing structures 42, 44, 46, 48, 50 and 52 can be formed by, for example, chemical-mechanical polishing. Preferably, such surface is substantially planar to the extent that the roughness of the common upper surface is defined by less than 5 Å root mean square (rms) variation. More preferably, the roughness is defined by less than 2 Å rms variation.

In the shown embodiment, insulative material 40 comprises an upper surface 41 that is planar and coextensive with the upper surfaces of silicon-containing structures 42, 44, 46, 48, 50 and 52. The shown structure can be formed by, for example, chemical-mechanical planarization of insulative material 40 together with the silicon material of structures 42, 44, 46, 48, 50 and 52. It is to be understood, however, that the invention encompasses other embodiments (not shown) wherein insulative material 40 comprises an upper surface which is downwardly recessed relative to the upper surfaces of silicon-containing structures 42, 44, 46, 48, 50 and 52.

Figure 2:
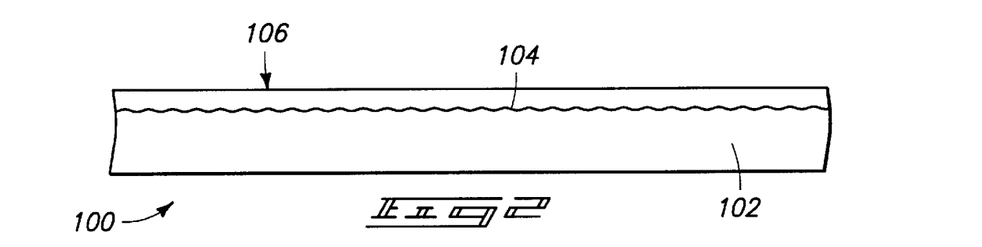
FIG. 2 is a diagrammatic, cross-sectional, fragmentary view of a second semiconductor substrate at a preliminary step of a method of the present invention.

FIG. 2 shows a second semiconductor substrate 100 comprising a semiconductive material wafer 102. Substrate 100 can be referred to as a second base. Semiconductive material wafer 102 can comprise, for example, monocrystalline silicon, and can be lightly doped with a background p-type dopant. Substrate 100 comprises a damage region 104 formed therein. Damage region 104 can be formed by, for example, implanting hydrogen ions into wafer 102. Wafer 102 has an upper surface 106 which is preferably substantially planar, with the term "substantially planar" again referring to a surface defined by a roughness of less than 5 Å rms, and more preferably less than 2 Å rms.

Figure 3:
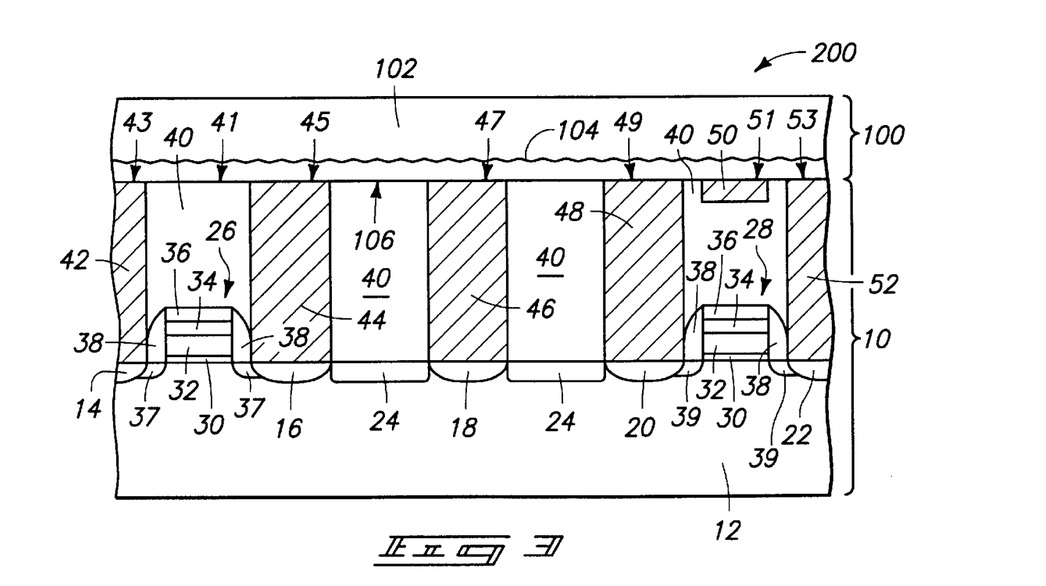
FIG. 3 is a diagrammatic, cross-sectional, fragmentary view of a semiconductive material comprising the first substrate of FIG. 1 and the second substrate of FIG. 2.

Referring to FIG. 3, second substrate 100 is inverted and bonded to first substrate 10 to form a structure 200. More specifically, surface 106 of substrate 102 is bonded to surfaces 43, 45, 47, 49, 51 and 53 of silicon-containing structures 42, 44, 46, 48, 50 and 52. Surface 106 and surfaces 43, 45, 47, 49, 51 and 53 can be cleaned with, for example, hydrofluoric acid, immediately prior to the bonding to remove native oxide from over such surfaces. The bonding of substrate 100 to substrate 110 preferably comprises a temperature of less than or equal to about 700° C. and can comprise, for example, a temperature of about 700° C. for a time of at least about 15 minutes. A suitable time can be from about 15 minutes to about two hours. The bonding can occur under a nitrogen atmosphere at about atmospheric pressure, or alternatively can occur under a vacuum. A suitable vacuum is less than or equal to about 500 mTorr, and preferably less than or equal to about 10 mTorr. In a particular embodiment, the bonding can comprise a first temperature treatment of less than about 500° C., and a second temperature treatment of less than or equal to about 700° C. The treatment occurring at a temperature of less than about 500° C. is utilized as a preliminary bonding prior to cleaving of substrate 100 (described below with reference to FIG. 4), and the bonding at 700° C. occurs after such cleaving to enhance chemical coupling between substrate 102 and silicon-containing structures 42, 44, 46, 48, 50 and 52.

In particular embodiments of the invention, the only temperatures utilized for bonding are less than or equal to 700° C., and monocrystalline wafer 12 is not exposed to temperatures exceeding 700° C. after the bonding. An advantage of utilizing temperatures less than or equal to about 700° C. for bonding and subsequent processing of structure 200 is that such can alleviate diffusion of dopants within semiconductor substrate 10 relative to diffusion which would occur at higher temperatures.

In embodiments in which diffusion of dopants is not considered problematic, temperatures above 700° C. can be utilized for bonding substrate 100 to substrate 10. If insulative material 40 comprises silicon dioxide, such embodiments can comprise temperatures high enough to bond the silicon dioxide to monocrystalline silicon of base 102, such as, for example, temperatures of 900° C. or greater. In such embodiments, base 102 will be bonded to upper surfaces 43, 45, 47, 49, 51 and 53 of silicon-containing structures 42, 44, 46, 48, 50 and 52, and will also be bonded to upper surface 41 of insulative material 40.

If bonding is conducted at temperatures wherein the bonding of monocrystalline base 102 is only to silicon-containing structures (e.g., 42, 44, 46, 48, 50 and 52), it can be advantageous to add additional silicon-containing structures to substrate 10. Structure 50 is an exemplary silicon-containing structure which has been added to substrate 10 solely for the purpose of enhancing bonding. In the shown embodiment, structure 50 extends only partially through insulative material 40. In other embodiments, additional silicon-containing structures could be formed which extend entirely through insulative material 40, and which, like structure 50, have no function other than bonding of substrate 100 to substrate 10.

Figure 4:
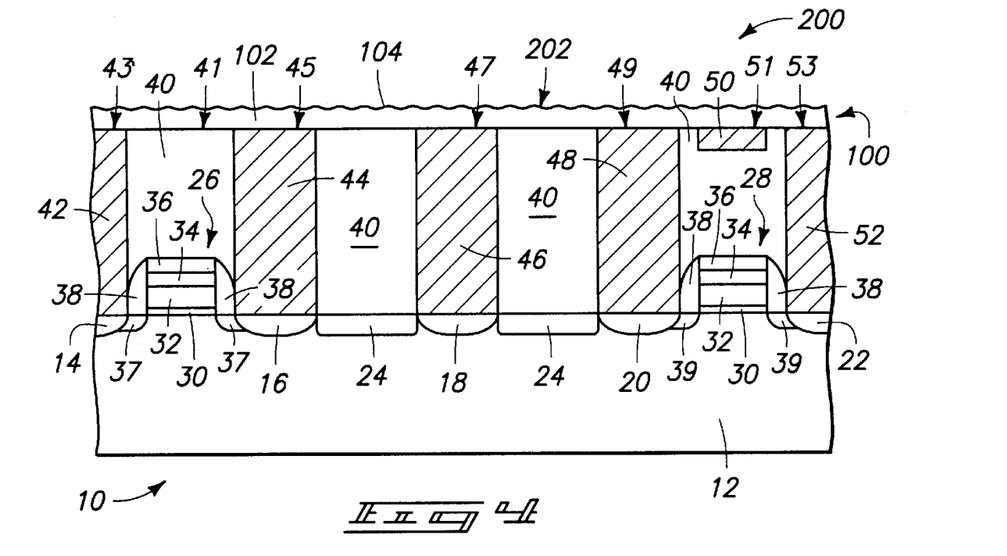
FIG. 4 is a diagrammatic, cross-sectional, fragmentary view of the FIG. 3 fragment shown at a processing step subsequent to that of FIG. 3.
Figure 5:
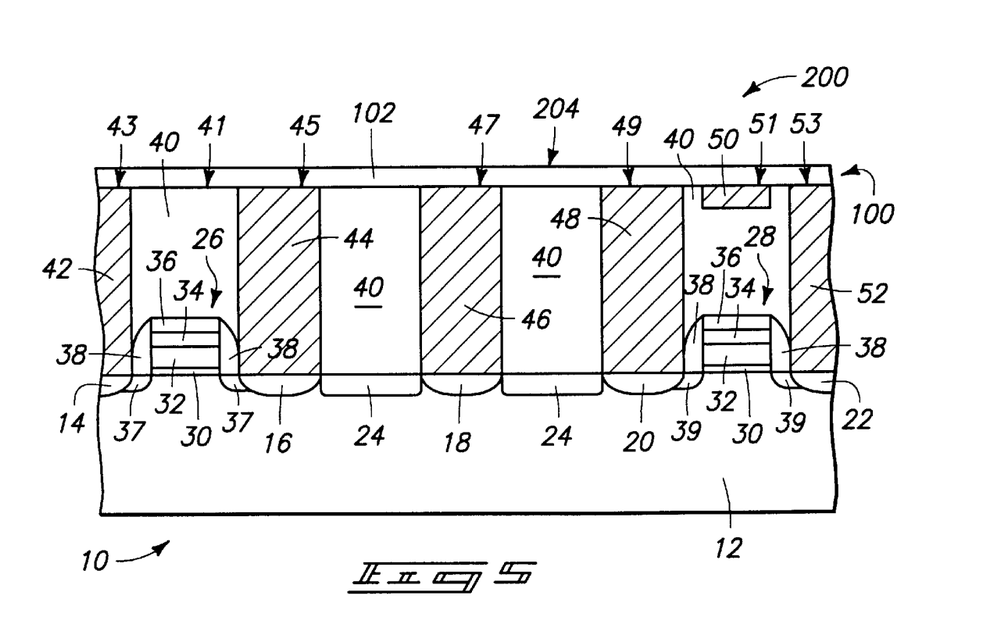
FIG. 5 is a view of the FIG. 3 fragment shown at a processing step subsequent to that of FIG. 4.

Referring to FIG. 4, substrate 100 is cleaved along damage region 104. In embodiments in which damage region 104 corresponds to a region wherein hydrogen ions were implanted, the cleavage can be accomplished by thermal processing. Suitable thermal processing can include, for example, exposure of damage region 104 to a temperature of greater than or equal to about 500° C.

The cleavage leaves a roughened upper surface 202 of structure 200. Such surface can be planarized by, for example, chemical-mechanical planarization to form the planar upper surface 204 shown in FIG. 5. In particular embodiments, the thickness of fragment 102 remaining after cleavage (FIG. 4) is about 0.5 microns, and the thickness after planarization (FIG. 5) is about 0.3 microns. The planarization shown in FIG. 5 can be referred to as "smoothing" of the roughened upper surface 202 of the FIG. 4 structure 200.

Figure 6:
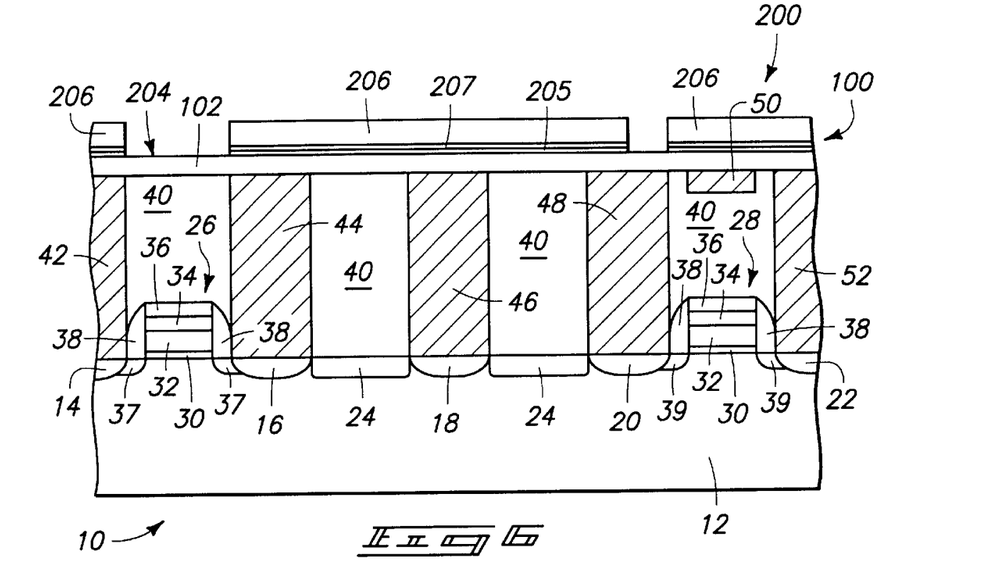
FIG. 6 is a view of the FIG. 3 fragment shown at a processing step subsequent to that of FIG. 5.
Figure 7:
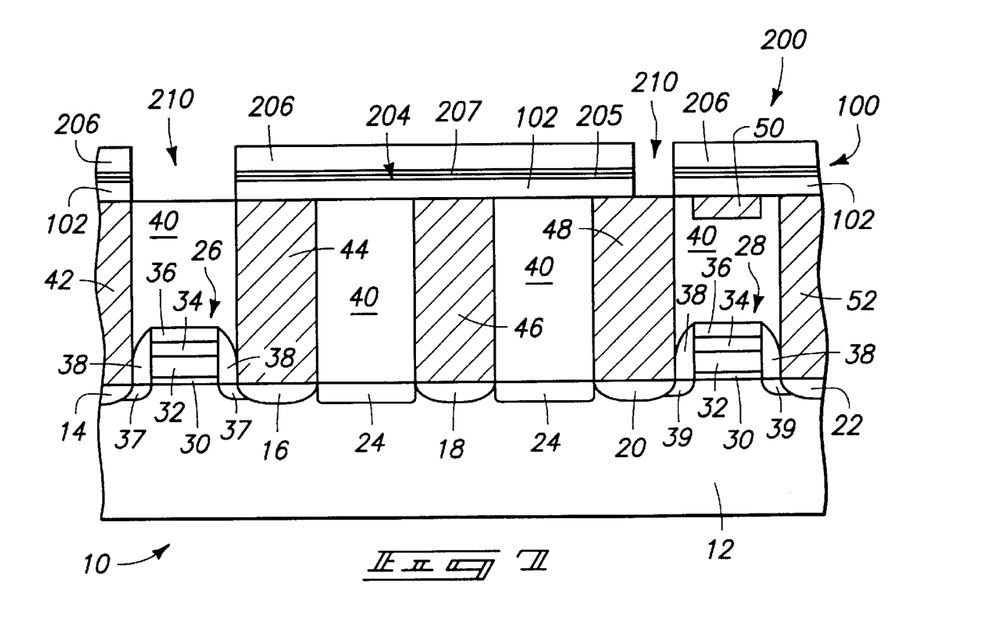
FIG. 7 is a view of the FIG. 3 fragment shown at a processing step subsequent to that of FIG. 6.

FIGS. 6–15 illustrate formation of insulative and conductive elements over and on monocrystalline base 102 of structure 200. Referring to FIG. 6, protective layers 205 and 207 (which can comprise, for example, silicon dioxide and silicon nitride, respectively) are formed, and a patterned masking layer 206 is formed over the protective layers. Patterned masking layer 206 can comprise, for example, photoresist, and can be patterned by photolithographic processing. Patterned masking layer 206 covers some portions of monocrystalline base 102, while leaving other portions exposed. Referring to FIG. 7, the exposed portions of base 102 are removed to leave gaps 210 extending to upper surfaces of substrate 10. In embodiments in which material 102 comprises monocrystalline silicon, such can be removed by, for example, an etch utilizing one or more of $CF_4$, $O_2$, and $CF_3Cl$.

Figure 8:
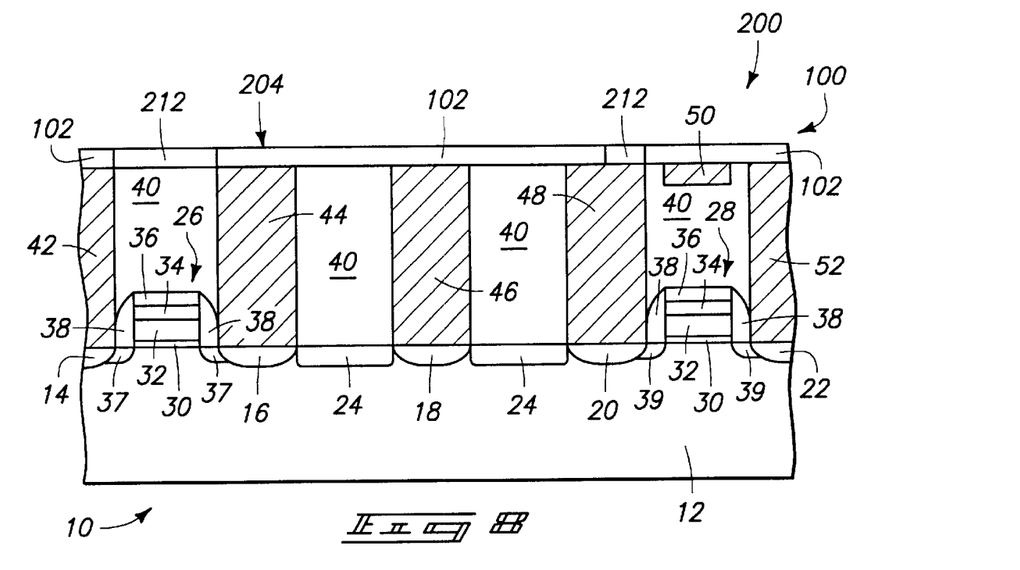
FIG. 8 is a view of the FIG. 3 fragment shown at a processing step subsequent to that of FIG. 7.

Referring to FIG. 8, gaps 210 (FIG. 7) are filled with insulative material 212, and masking layer 206 (FIG. 7) and protective layers 205 and 207 are removed. The removal of layers 205, 206 and 207 can be accomplished by, for example, chemical-mechanical polishing. Insulative material 212 can comprise, for example, silicon dioxide or silicon nitride. The processing of FIGS. 6–8 can be referred to as a trench/refill process for forming insulative material within substrate 102. In the shown embodiment, gaps 210 (FIG. 7) are formed to extend entirely through base 102, and accordingly, insulative material 212 extends entirely through base 102. In other embodiments (not shown) at least some of the gaps can be formed to extend only partially into base 102, and accordingly at least some of insulative material 212 will extend only partially through base 102. Insulative regions 212 can comprise isolation regions between devices formed on and within base 102. Although the shown method of forming isolation regions is a trench/refill method, it is to be understood that other methods, such as, for example, local oxidation of silicon, could be utilized for forming isolation regions within a monocrystalline base 102. The insulative regions are shown having a planarized upper surface, and such can be accomplished by, for example, chemical-mechanical polishing. It is noted that the described trench/refill can comprise forming the insulative material over the masking layer and within the gaps, and subsequent chemical-mechanical polishing to leave the insulative material within the gaps while removing the masking layer and insulative material thereover. Alternatively, the trench/refill can comprise removing the masking layer prior to forming the insulative material within the gaps.

Figure 9:
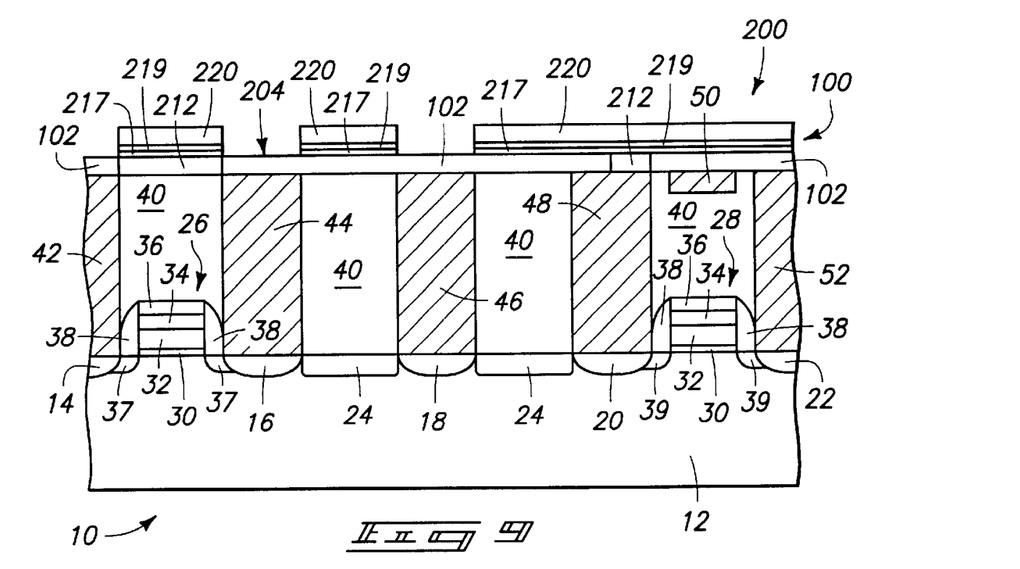
FIG. 9 is a view of the FIG. 3 fragment shown at a processing step subsequent to that of FIG. 8.

Referring to FIG. 9, protective layers 217 and 219 (which can comprise, for example, silicon dioxide and silicon nitride, respectively) are formed. Subsequently, a patterned masking layer 220 is formed over the protective layers, over a surface 204 of base 102, and over at least some of isolation regions 212. Portions of base 102 are covered by masking layer 220, while other portions are exposed. A pattern is transferred from masking layer 220 to underlying layers 217 and 219, as shown.

Figure 10:
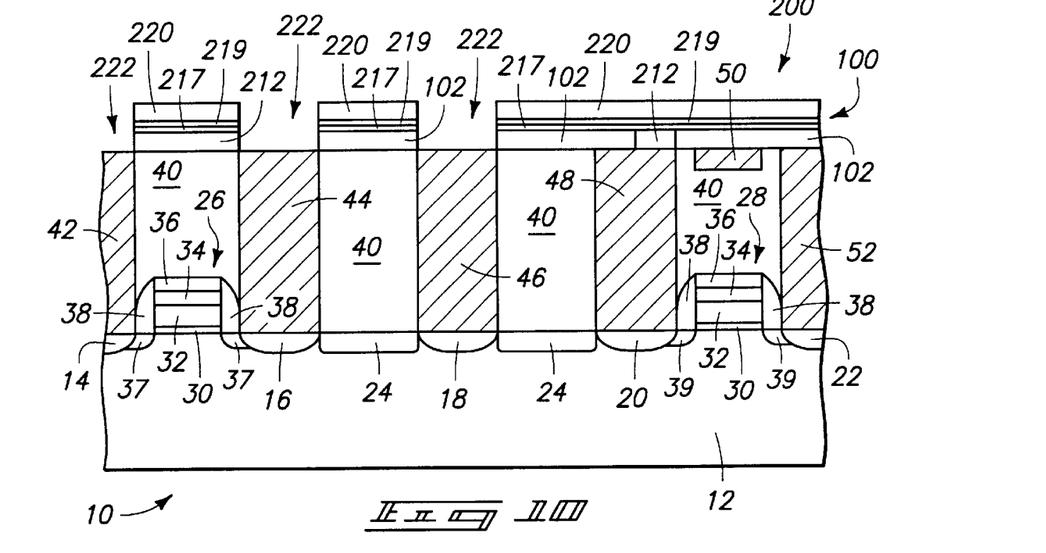
FIG. 10 is a view of the FIG. 3 fragment shown at a processing step subsequent to that of FIG. 9.

Referring to FIG. 10, the exposed portions of base 102 are removed to form gaps 222 extending through material 102 and to an upper surface of substrate 10. Gaps 222 can be formed utilizing processing similar to that described above with reference to FIG. 7 for forming gaps 210.

Figure 11:
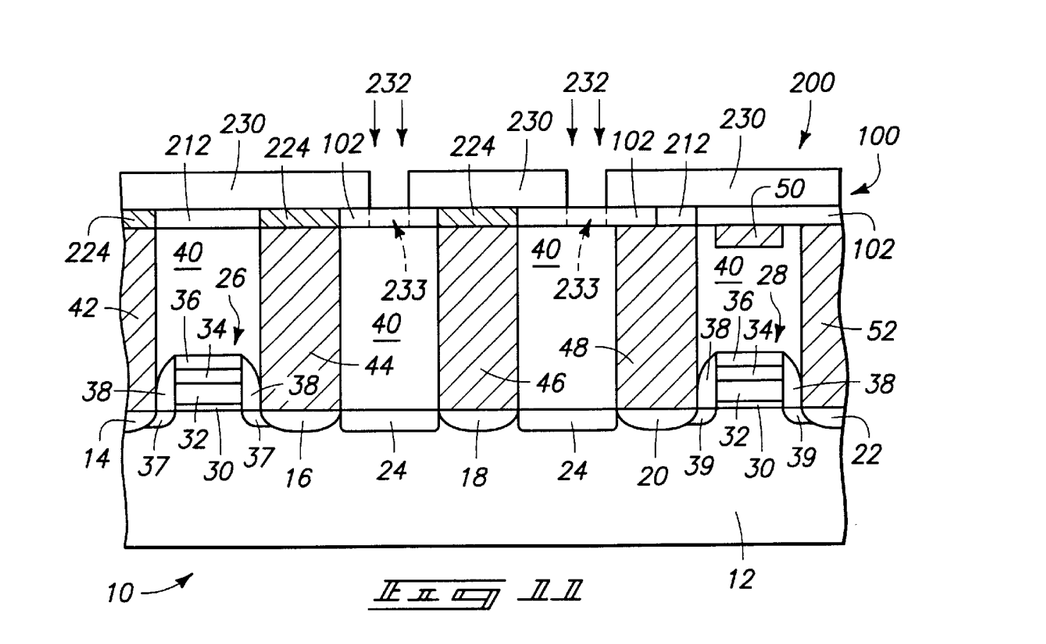
FIG. 11 is a view of the FIG. 3 fragment shown at a processing step subsequent to that of FIG. 10.

Referring to FIG. 11, patterned masking layer 220 (FIG. 10) is removed and gaps 222 (FIG. 10) are filled with conductive material 224. Conductive material is typically formed within gaps 222 and over protective layers 217 and 219 (FIG. 10). Subsequently, the conductive material is removed from over the protective layers, and the protective layers are removed from over material 102. Layer 217 and 219 protect material 102 during removal of conductive material 224, as it can be difficult to selectively etch a preferred conductive material (doped silicon) relative to the monocrystalline material 102. A problem that can occur after forming conductive material 224 in gaps 222 is that leaky diodes can form at interfaces between material 224 and monocrystalline material 102. Such problem can be alleviated by lateral out-diffusion from material 224 into material 102 so that junctions are formed within material 102 rather than at interfaces of materials 102 and 224. The out-diffusion can be accomplished by, for example, a thermal treatment, and can laterally out-diffuse dopant to a distance of, for example, about 100 Å into material 102 from the interface of materials 102 and 224.

The conductively doped silicon of material 224 can be in the form of amorphous silicon, polycrystalline silicon, or monocrystalline silicon. Conductive material 224 can comprise, either alternatively or in addition to conductively doped silicon, other conductive materials such as, for example, metals or metal silicide. If the conductive material 224 comprises doped silicon, such can be either n-type doped silicon or p-type doped silicon. In particular embodiments it will be heavily n-type doped silicon (i.e., doped to a concentration greater than $1 \times 10^{19}$ atoms/cm$^3$ with an n-type dopant). Although conductive regions 224 are shown extending entirely through base 102, it is to be understood that regions 224 can extend either entirely into base 102 as shown, or only partially into base 102 in other embodiments (not shown).

A patterned masking layer 230 is formed over conductive material 224, insulative material 212, and some portions of base 102, while leaving other portions of base 102 exposed. Masking layer 230 can also be formed over channel regions, junction regions, and/or shallow trench isolation regions. A conductivity enhancing dopant 232 is implanted into the exposed portions of base 102 to form threshold voltage ($V_t$) implant regions 233 within base 102. The $V_t$ implant regions can extend entirely through base 102, or only partially into base 102. The $V_t$ implant regions can be formed with a blanket implant into an entirety of an upper surface of semiconductive material 102, and/or can be implanted through patterned photoresist for special adjustments. In exemplary applications, openings for $V_t$ implants could extend over at least one channel and one or more of junctions and isolation regions.

Figure 12:
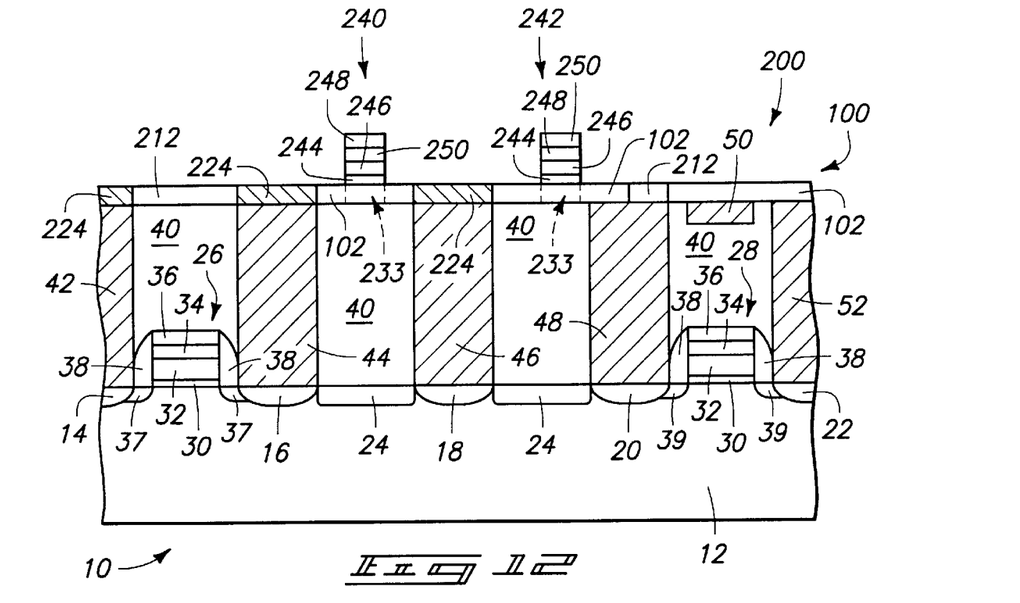
FIG. 12 is a view of the FIG. 3 fragment shown at a processing step subsequent to that of FIG. 11.

Referring to FIG. 12, masking layer 230 (FIG. 11) is removed and transistor gates 240 and 242 are formed over the $V_t$ implant regions 233. Transistor gates 240 and 242 comprise a gate oxide layer 244, a polysilicon layer 246, a metal silicide layer 248 and an insulative cap 250. Transistor gates 240 and 242 are conventional transistor gate structures, and provided as exemplary embodiments of transistor gates which can be formed. It is to be understood that other types of transistor gates, as well as other circuit devices, can be formed over base 102.

Figure 13:
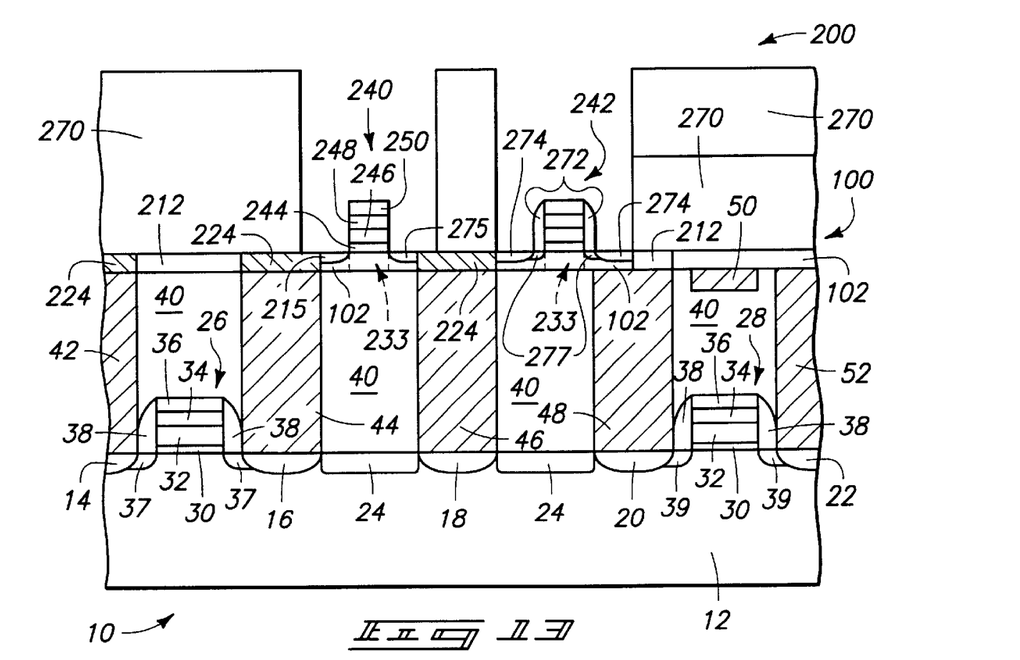
FIG. 13 is a view of the FIG. 3 fragment shown at a processing step subsequent to that of FIG. 12.

Referring to FIG. 13, a patterned masking layer is formed over some of base 102, while leaving transistors gate 240 and 242, and regions proximate transistor gates 240 and 242, exposed. Insulative material sidewall spacers 272 are shown formed along sidewalls of transistor gate 242, and not along sidewalls of gate 240. Sidewall spacers 272 can be formed by conventional methods, including, by depositing and subsequently anisotropically etching an insulative material. the spacers can be selectively formed to be only along sidewalls of gate 242, and not along sidewalls of gate 240, by, for example, initially forming spacers along sidewalls of both of gates 240 and 242, and subsequently protecting the spacers along gate 242 while etching the spacers from along gate 240. Sidewall spacers 272 can comprise, for example, silicon dioxide or silicon nitride. In typical processing, a protective mask would be formed over transistor gate 240 while sidewall spacers 272 are formed alongside transistor gate 242. Alternatively, spacers could be formed alongside sidewalls of gate 240, as well as alongside the sidewalls of gate 242.

Source/drain regions 274 and 275 are implanted proximate gates 240 and 242, and Ldd regions 277 are implanted between source/drain regions 274 and gate 242. Ldd regions 277 can be implanted prior to formation of spacers 272, or with an angled implant after formation of spacers 272. Gate 242 and source/drain regions 274 define a field effect transistor, while gate 240 and source/drain regions 275 define another field effect transistor. In the shown embodiment, source/drain regions 274 are implanted only partially into base 102. It is to be understood, however, that the invention encompasses other embodiments wherein source/drain regions are implanted deep enough into base 102 to extend entirely through the base.

Source/drain regions 275 are, in addition to being source/drain regions, conductive interconnections between circuitry above base 102 and circuitry below base 102. Specifically, source/drain regions 275 interconnect with regions 224, which in turn interconnect to circuitry beneath base 102. The regions 224 interconnect with source/drain regions 275 can be considered extensions of the source/drain regions. Source drain regions 275 allow some misalignment of patterning to form transistor gate 240, as the regions 275 will extend between gate 240 and regions 224 regardless of whether gate 240 is precisely centered between adjacent regions 224 or not.

Figure 14:
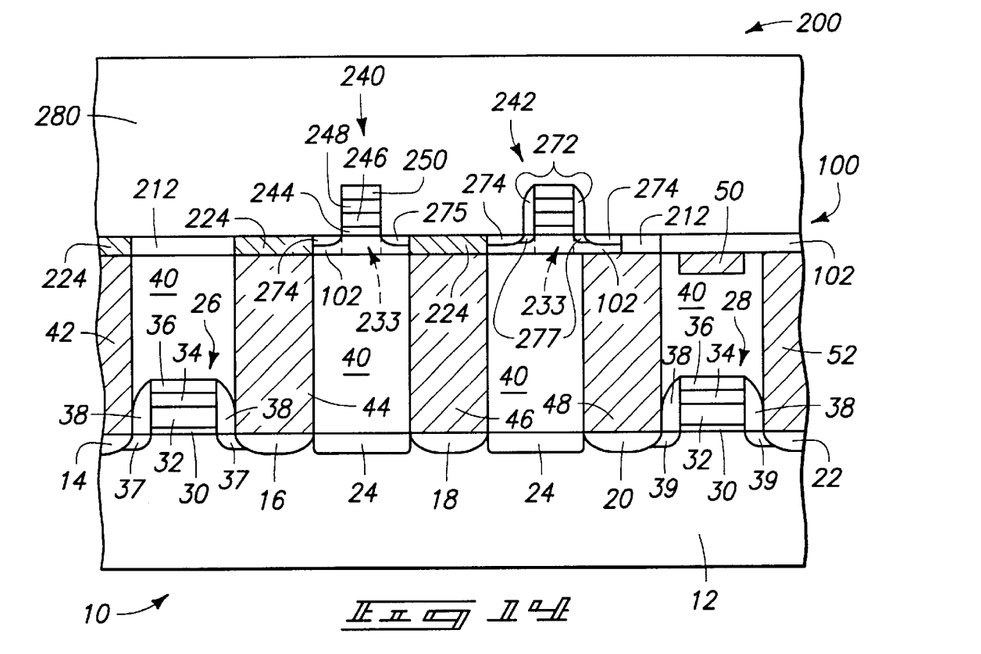
FIG. 14 is a view of the FIG. 3 fragment shown at a processing step subsequent to that of FIG. 13.

Referring to FIG. 14, masking layer 270 (FIG. 13) is removed, and an insulative material 280 is formed over substrate 100 and transistor gates 240 and 242. Insulative material 280 can comprise, for example, BPSG.

Figure 15:
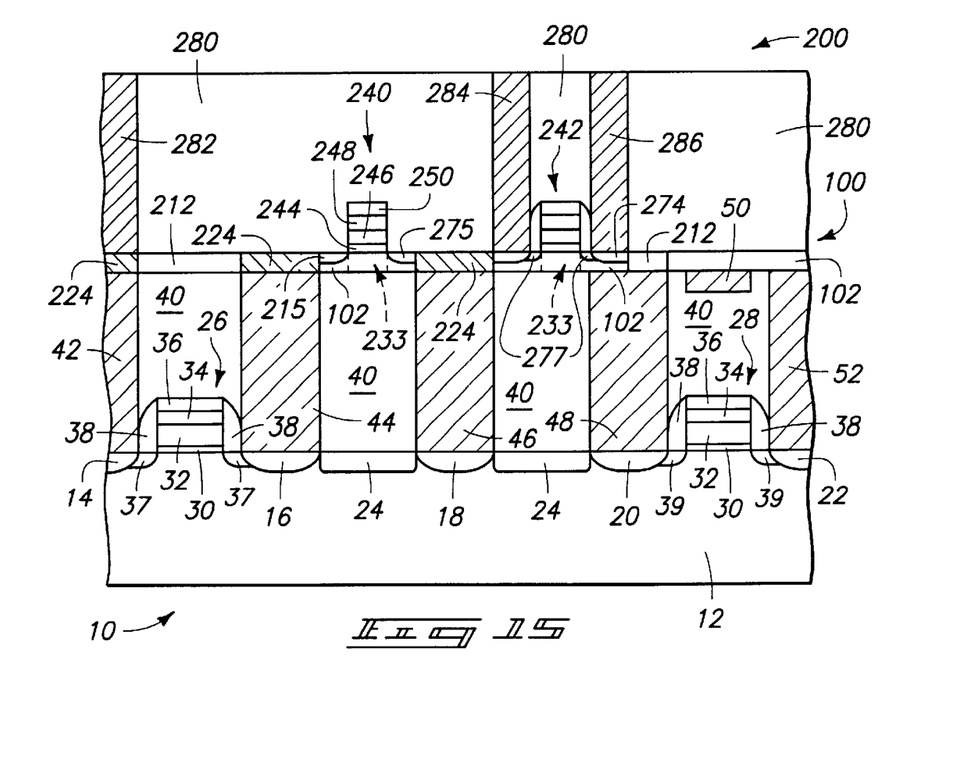
FIG. 15 is a view of the FIG. 3 fragments shown at a processing step subsequent to that of FIG. 14.

Referring to FIG. 15, openings are etched into insulative material 280 and conductive structures 282, 284 and 286 are formed within the openings. Conductive structures 282, 284 and 286 can comprise, for example, one or more of conductively-doped amorphous silicon, polycrystalline silicon, or monocrystalline silicon. Structures 282, 284 and 286 can thus comprise silicon-containing structures. In subsequent processing (not shown) another semiconductor substrate can be bonded to silicon-containing structures 282, 284 and 286 and processing analogous to that of FIGS. 6–15 repeated to form circuitry on the next semiconductor substrate. Accordingly, a stack of semiconductor substrates and circuitry can be formed.

In other embodiments, structures 282, 284 and 286 can comprise other conductive materials besides silicon, such as, for example, metals and/or metal silicides.

In particular processing, at least one of the transistors comprising gates 26 and 28 between semiconductive material bases 12 and 102 is of a different type than at least one of the transistors comprising gates that are on semiconductive material base 102. For instance, at least one of the transistors comprising gates 26 and 28 can be a PMOS transistor, and at least one of the transistors comprising gates 240 and 242 can be an NMOS transistor. In other embodiments, one type of transistor will be formed over base 102 which is not formed between bases 102 and 12. For instance, only n-type transistors can be formed between bases 102 and 12, and both n-type and p-type transistors can be formed over base 102. In still other embodiments, one type of transistor will be formed over between bases 12 and 102 which is not formed over base 102. For instance, only n-type transistors can be formed over base 102, and both n-type and p-type transistors can be formed between bases 12 and 102.

Processing of the present invention can be utilized with either or both of logic and memory device constructions. In particular embodiments the processing can be utilized to form DRAM constructions having increased device density and increased data retention relative to conventional DRAM constructions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:
   a first substrate comprising silicon-containing structures separated from one another by an insulative material; the silicon-containing structures defining an upper surface; and
   a second substrate; the second substrate comprising a monocrystalline material bonded over the silicon-containing structures at the upper surface and being a semiconductor substrate.

2. The construction of claim 1 further comprising one of either a PMOS or NMOS transistor having a gate between the first and second substrates; and the other of a PMOS or NMOS transistor having a gate over the second substrate.

3. The construction of claim 1 further comprising only one type of PMOS type or NMOS type transistors having a gate between the first and second substrates; and the other type PMOS type and NMOS type transistors having a gate over the second substrate.

4. The construction of claim 1 further comprising only one type of PMOS type or NMOS type transistors having a gate between the first and second substrates; and both types of PMOS type and NMOS type transistors having gates over the second substrate.

5. The construction of claim 1 further comprising both types of PMOS type and NMOS type transistors having gates between the first and second substrates; and only one type of the PMOS type and NMOS type transistors having a gate over the second substrate.

6. The construction of claim 1 wherein the monocrystalline material of the second substrate is monocrystalline silicon.

7. The construction of claim 1 wherein the silicon-containing structures comprise conductively-doped silicon.

8. The construction of claim 1 wherein the silicon-containing structures comprise amorphous silicon.

9. The construction of claim 1 wherein the silicon-containing structures comprise polycrystalline silicon.

10. The construction of claim 1 wherein the silicon-containing structures comprise monocrystalline silicon.

11. A semiconductor construction, comprising:
    a first semiconductor substrate comprising a first monocrystalline base and silicon-containing structures above the base, at least some of the silicon-containing structures being separated from one another by an insulative material; the silicon-containing structures and insulative material together defining an upper surface above the first monocrystalline base; and
    a second semiconductor substrate comprising a second monocrystalline base bonded to the silicon-containing structures at the upper surface above the first monocrystalline base.

12. The construction of claim 8 the first and second monocrystalline bases comprise monocrystalline silicon.

13. The construction of claim 8 wherein the second monocrystalline base is bonded to the insulative material at the upper surface above the first monocrystalline base.

14. The construction of claim 8 further comprising at least one electrically insulative region extending through the second monocrystalline base.

15. The construction of claim 8 further comprising at least one doped silicon region extending through the second monocrystalline base and electrically contacting at least one of the silicon-containing structures.

16. The construction of claim 8 further comprising:
    at least one doped silicon region extending through the second monocrystalline base and electrically contacting at least one of the silicon-containing structures; and
    at least one insulative region extending through the second monocrystalline base.

17. The construction of claim 8 further comprising:
    at least one doped silicon region extending through the second monocrystalline base and electrically contacting at least one of the silicon-containing structures; and
    at least one doped silicon region within the second monocrystalline base, but which does not extend entirely through the second monocrystalline base.

\* \* \* \* \*

UNITED STATES PATENT AND TRADEMARK OFFICE
CERTIFICATE OF CORRECTION

PATENT NO. : 6,653,677 B2
DATED : November 25, 2003
INVENTOR(S) : Fernando Gonzalez It is certified that error appears in the above-identified patent and that said Letters Patent is hereby corrected as shown below:

Column 2,
Line 51, after "Fig. 3" please replace "fragments" with -- fragment --.

Column 4,
Line 26, before "to" please replace "planarized-relative" with -- planarized relative --.

Column 7,
Line 64, after "leaving" please replace "transistors gate" with -- transistor gates --.

Column 8,
Line 4, before "spacers" please replace "the" with -- The --.

Column 9,
Line 8, after "formed" please delete "over".

Column 10,
Line 27, after "claim" please replace "8" with -- 11 wherein --.
Lines 29, 30, 33, 37 and 43, after "claim" please replace "8" with -- 11 --.

Signed and Sealed this

Twenty-fourth Day of May, 2005

JON W. DUDAS
*Director of the United States Patent and Trademark Office*